(12) United States Patent
Chen et al.

(10) Patent No.: US 12,471,383 B2
(45) Date of Patent: Nov. 11, 2025

(54) TRANSIENT VOLTAGE SUPPRESSION DEVICE

(71) Applicant: AMAZING MICROELECTRONIC CORP., New Taipei (TW)

(72) Inventors: Chih-Wei Chen, Zhubei (TW); Kuan-Yu Lin, New Taipei (TW); Mei-Lian Fan, Hukou Township (TW); Kun-Hsien Lin, Hsinchu (TW)

(73) Assignee: AMAZING MICROELECTRONIC CORP., New Taipei (TW)

(*) Notice: Subject to any disclaimer, the term of this patent is extended or adjusted under 35 U.S.C. 154(b) by 422 days.

(21) Appl. No.: 18/098,517

(22) Filed: Jan. 18, 2023

(65) Prior Publication Data

US 2024/0243119 A1 Jul. 18, 2024

(51) Int. Cl.
*H10D 8/00* (2025.01)
*H10D 89/60* (2025.01)

(52) U.S. Cl.
CPC ............ *H10D 89/60* (2025.01); *H10D 8/00* (2025.01)

(58) Field of Classification Search
CPC .......... H10D 89/60; H10D 8/00; H10D 8/80; H10D 89/713; H10D 10/00; H10D 62/124
See application file for complete search history.

(56) References Cited

U.S. PATENT DOCUMENTS

| | | | |
|---|---|---|---|
| 7,875,933 B2 | 1/2011 | Schneider et al. | |
| 8,350,355 B2 | 1/2013 | Esmark | |
| 8,431,999 B2 | 4/2013 | Shen et al. | |
| 8,552,530 B2 | 10/2013 | Lin et al. | |
| 9,881,914 B2 | 1/2018 | Sorgeloos et al. | |
| 10,573,635 B2 | 2/2020 | Chen et al. | |
| 2012/0241903 A1* | 9/2012 | Shen | H10D 89/611 257/E29.166 |

FOREIGN PATENT DOCUMENTS

| | | |
|---|---|---|
| TW | 202105723 A | 2/2021 |
| TW | 202207410 A | 2/2022 |

\* cited by examiner

*Primary Examiner* — Wasiul Haider
(74) *Attorney, Agent, or Firm* — Birch, Stewart, Kolasch & Birch, LLP

(57) ABSTRACT

A transient voltage suppression device includes at least one N-type lightly-doped structure, a first P-type well, a second P-type well, a first N-type heavily-doped area, and a second N-type heavily-doped area. The first P-type well and the second P-type well are formed in the N-type lightly-doped structure. The first N-type heavily-doped area and the second N-type heavily-doped area are respectively formed in the first P-type well and the second P-type well. The doping concentration of the first P-type well is higher than that of the second P-type well. The first P-type well and the second P-type well can be replaced with P-type lightly-doped wells respectively having P-type heavily-doped areas under the N-type heavily-doped areas.

4 Claims, 14 Drawing Sheets

TRANSIENT VOLTAGE SUPPRESSION DEVICE

BACKGROUND OF THE INVENTION

Field of the Invention

The present invention relates to a suppression device, particularly to a transient voltage suppression device.

Description of the Related Art

As the IC device sizes have been shrunk to nanometer scale, the consumer electronics, like the laptop and mobile devices, have been designed to be much smaller than ever. Without suitable protection devices, the functions of these electronics could be reset or even damaged under electrostatic discharge (ESD) events. Currently, all consumer electronics are expected to pass the ESD test requirement of IEC 61000-4-2 standard. Transient voltage suppressor (TVS) is generally designed to bypass the ESD energy, so that the electronic systems can be prevented from ESD damages.

The working principle of TVS is shown in FIG. 1. In FIG. 1, a transient voltage suppression (TVS) device 10 is connected in parallel with a protected circuit 12 on the printed circuit board (PCB). The transient voltage suppression device 10 would be triggered immediately when the ESD event occurs. In that way, the transient voltage suppression device 10 can provide a superiorly low resistance path for discharging the transient ESD current, so that the energy of the ESD transient current can be bypassed by the transient voltage suppression device 10. As shown in FIG. 2, the conventional transient voltage suppression device includes an N-type substrate 14, two P-type doped wells 16, two N-type heavily-doped areas 18, and a current blocking structure 20. The P-type doped wells 16 are formed in the N-type substrate 14. The N-type heavily-doped areas 18 are formed in the P-type doped wells 16. The transient voltage suppression device has a discharging path. The discharging path is formed by the N-type substrate 14, the P-type doped wells 16, and two of the N-type heavily-doped areas 18. The N-type substrate 14, the P-type doped wells 16, and two of the N-type heavily-doped areas 18 form two NPN bipolar junction transistors (BJT) coupled in series. The current blocking structure 20 can block an ESD current that flows along the upper surface of the N-type substrate 14. Thus, the ESD current flows to the deeper region of the N-type substrate 14, thereby increasing the clamping voltage.

To overcome the abovementioned problems, the present invention provides a transient voltage suppression device, so as to solve the afore-mentioned problems of the prior art.

SUMMARY OF THE INVENTION

The present invention provides a transient voltage suppression device, which has a low parasitic capacitance, a low clamping voltage, and strong ESD robustness.

The present invention provides a transient voltage suppression device which includes at least one N-type lightly-doped structure, a first P-type well, a second P-type well, a first N-type heavily-doped area, and a second N-type heavily-doped area. The first P-type well and the second P-type well are formed in the N-type lightly-doped structure. The first N-type heavily-doped area and the second N-type heavily-doped area are respectively formed in the first P-type well and the second P-type well. The doping concentration of the first P-type well is higher than that of the second P-type well.

In an embodiment of the present invention, the N-type lightly-doped structure is an N-type lightly-doped substrate.

In an embodiment of the present invention, the first N-type heavily-doped area and the second N-type heavily-doped area are respectively coupled to a first pin and a second pin.

In an embodiment of the present invention, the second P-type well has a sidewall between the first P-type well and the second N-type heavily-doped area. The second N-type heavily-doped area has a first shortest distance from the sidewall of the second P-type well. The second N-type heavily-doped area has a second shortest distance from the bottom of the second P-type well. The first shortest distance is greater than or equal to the second shortest distance.

In an embodiment of the present invention, the transient voltage suppression device further includes a P-type lightly-doped substrate. The at least one N-type lightly-doped structure includes two N-type lightly-doped structures. The two N-type lightly-doped structures are N-type lightly-doped wells. The N-type lightly-doped wells are formed in the P-type lightly-doped substrate. The first P-type well and the second P-type well are respectively formed in the N-type lightly-doped wells.

In an embodiment of the present invention, a transient voltage suppression device includes at least one N-type lightly-doped structure, two P-type wells, a first N-type heavily-doped area, a second N-type heavily-doped area, and two P-type doped areas. The P-type wells are formed in the N-type lightly-doped structure. The first N-type heavily-doped area and the second N-type heavily-doped area are respectively formed in the P-type wells. The P-type doped areas, respectively formed in the P-type wells, respectively directly touch the bottoms of the first N-type heavily-doped area and the second N-type heavily-doped area. The doping concentration of the P-type doped area is higher than that of the P-type well.

In an embodiment of the present invention, the layout sizes of the first N-type heavily-doped area and the second N-type heavily-doped area are respectively larger than or equal to the layout sizes of the two P-type doped areas.

In an embodiment of the present invention, the N-type lightly-doped structure is an N-type lightly-doped substrate.

In an embodiment of the present invention, the first N-type heavily-doped area and the second N-type heavily-doped area are respectively coupled to a first pin and a second pin.

In an embodiment of the present invention, the transient voltage suppression device further includes a P-type lightly-doped substrate. The at least one N-type lightly-doped structure includes two N-type lightly-doped structures. The two N-type lightly-doped structures are N-type lightly-doped wells. The N-type lightly-doped wells are formed in the P-type lightly-doped substrate. The P-type wells are respectively formed in the N-type lightly-doped wells.

To sum up, the transient voltage suppression device embeds a silicon-controlled rectifier (SCR) into a bipolar junction transistor (BJT) to have a low parasitic capacitance, a low clamping voltage, and strong ESD robustness.

Below, the embodiments are described in detail in cooperation with the drawings to make easily understood the technical contents, characteristics and accomplishments of the present invention.

DETAILED DESCRIPTION OF THE INVENTION

Figure 1:
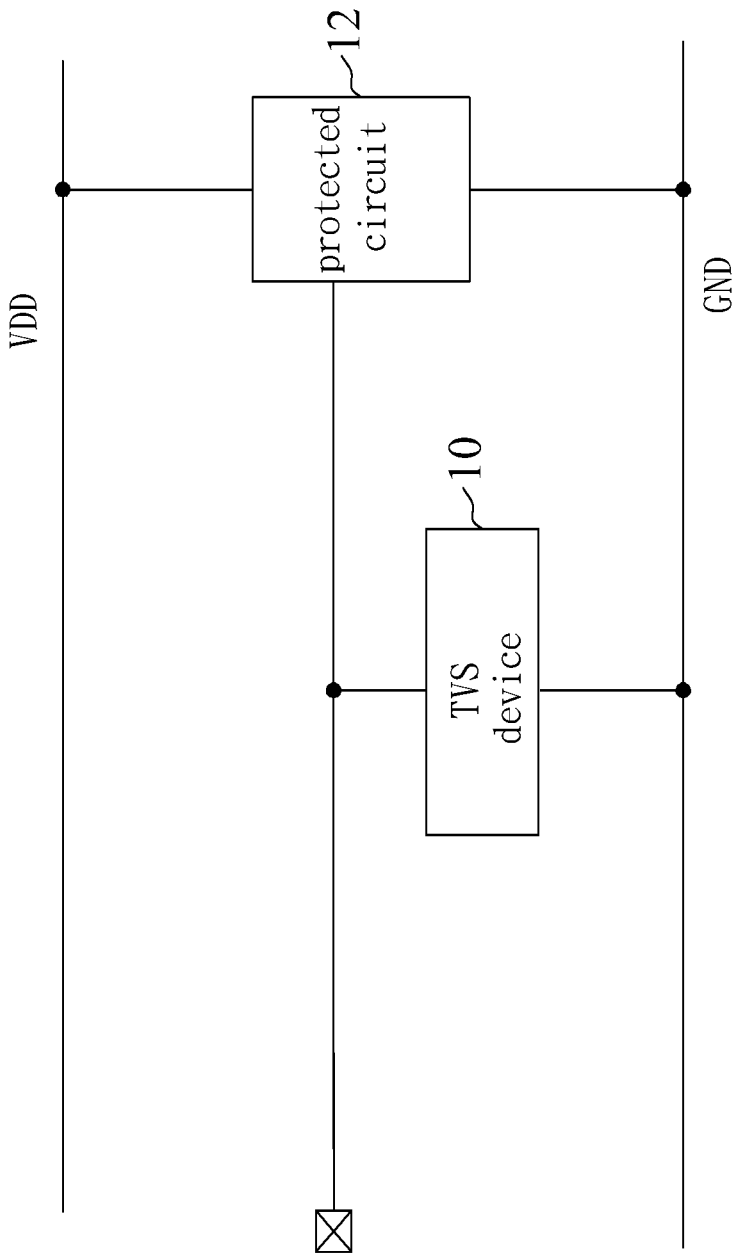
FIG. 1 is a schematic diagram illustrating a transient voltage suppression device connected with a protected circuit on an IC chip in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express what the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to using different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

In the following description, a transient voltage suppression device will be described. The transient voltage suppression device embeds a silicon-controlled rectifier (SCR) into a bipolar junction transistor (BJT) to have a low parasitic capacitance, a low clamping voltage, and strong ESD robustness.

Figure 3:
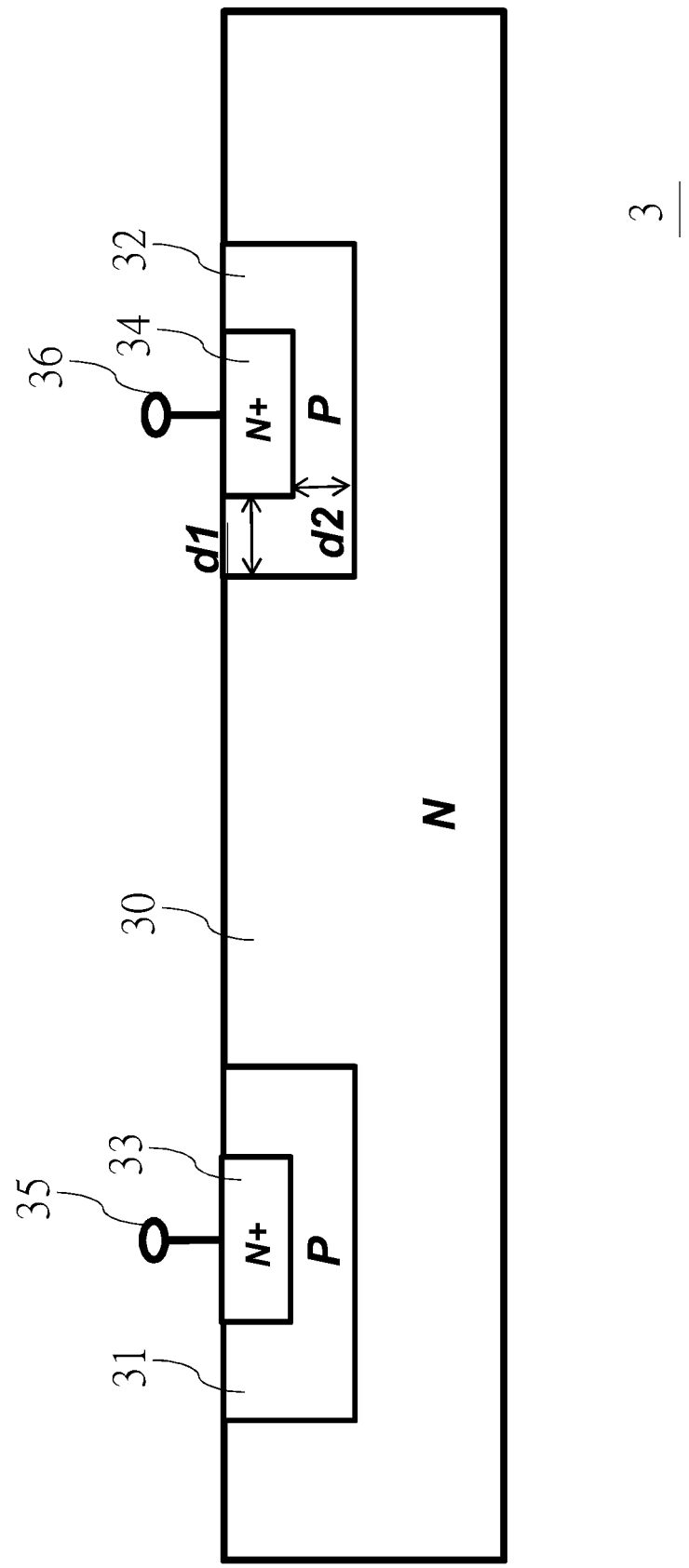
FIG. 3 is a cross-sectional view of a transient voltage suppression device according to a first embodiment of the present invention.

FIG. 3 is a cross-sectional view of a transient voltage suppression device according to a first embodiment of the present invention. Referring to FIG. 3, the first embodiment of the transient voltage suppression device is introduced as follows. A transient voltage suppression device 3 includes at least one N-type lightly-doped structure 30, a first P-type well 31, a second P-type well 32, a first N-type heavily-doped area 33, and a second N-type heavily-doped area 34. For convenience and clarity, the number of the N-type lightly-doped structure 30 is one. The N-type lightly-doped structure 30 is implemented with an N-type lightly-doped substrate. The first P-type well 31 and the second P-type well 32 are formed in the N-type lightly-doped structure 30. The first N-type heavily-doped area 33 and the second N-type heavily-doped area 34 are respectively formed in the first P-type well 31 and the second P-type well 32. The first N-type heavily-doped area 33 and the second N-type heavily-doped area 34 are respectively coupled to a first pin 35 and a second pin 36. Due to the N-type lightly-doped structure 30, the junction capacitance of the N-type lightly-doped structure 30 and the first P-type well 31 and the junction capacitance of the N-type lightly-doped structure 30 and the second P-type well 32 are low. In addition, the equivalent capacitance of the transient voltage suppression device 3 includes the junction capacitance of the first N-type heavily-doped area 33 and the first P-type well 31, the junction capacitance of the N-type lightly-doped structure 30 and the first P-type well 31, the junction capacitance of the second N-type heavily-doped area 34 and the second P-type well 32, and the junction capacitance of the N-type lightly-doped structure 30 and the second P-type well 32 coupled in series. Thus, the transient voltage suppression device 3 has a low parasitic capacitance. The doping concentration of the first P-type well 31 is higher than that of the second P-type well 32. Specifically, the first P-type well 31 may have a doping concentration of $10^{16}$~$10^{19}$ cm$^{-3}$ and the second P-type well 32 may have a doping concentration of $10^{14}$~$10^{18}$ cm$^{-3}$.

When a positive electrostatic discharge voltage is applied to the first pin 35, and a reference voltage lower than the positive electrostatic discharge voltage is applied to the second pin 36, an electrostatic discharge (ESD) current flows from the first pin 35 to the second pin 36 through the first N-type heavily-doped area 33, the first P-type well 31, the N-type lightly-doped structure 30, the second P-type well 32, and the second N-type heavily-doped area 34. In some embodiments, the second P-type well 32 may have a sidewall between the first P-type well 31 and the second N-type heavily-doped area 34. The second N-type heavily-doped area 34 has a first shortest distance d1 from the sidewall of the second P-type well 32. The second N-type heavily-doped area 34 has a second shortest distance d2 from the bottom of the second P-type well 32. The first shortest distance d1 is greater than or equal to the second shortest distance d2, such that the ESD current that flows along the upper surface of the N-type lightly-doped structure 30 is suppressed. Thus, most of the ESD current flows through the bottom of the second P-type well 32 to dissipate heat and improve the ESD robustness of the transient voltage suppression device 3.

Figure 4:
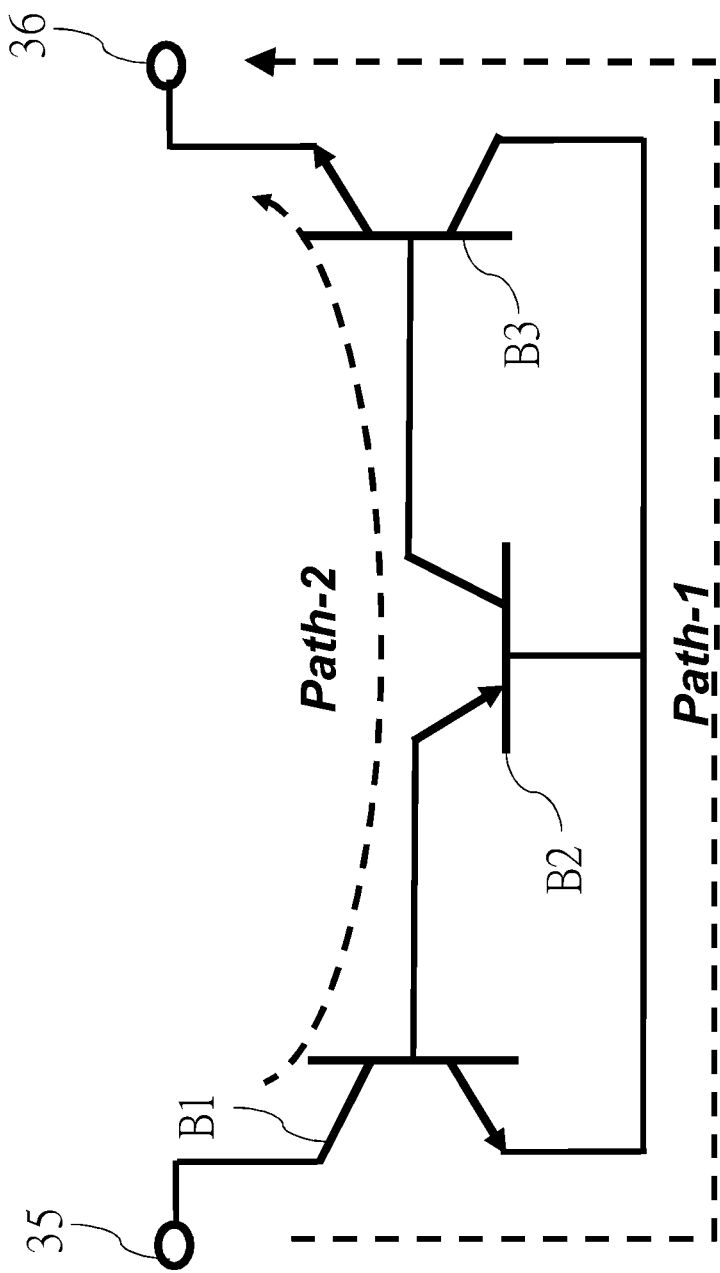
FIG. 4 is a schematic diagram illustrating an equivalent circuit of the transient voltage suppression device according to a first embodiment of the present invention.

FIG. 4 is a schematic diagram illustrating an equivalent circuit of the transient voltage suppression device according to a first embodiment of the present invention. Referring to FIG. 3 and FIG. 4, the first N-type heavily-doped area 33, the first P-type well 31, and the N-type lightly-doped structure 30 form a parasitic NPN BJT B1. The first P-type well 31, the N-type lightly-doped structure 30, and the second P-type well 32 form a parasitic PNP BJT B2. The N-type lightly-doped structure 30, the second P-type well 32, and the second N-type heavily-doped area 34 form a parasitic NPN BJT B3. The first P-type well 31 used as the emitter of the parasitic PNP BJT B2 has a higher doping concentration to increase the current gain of the parasitic PNP BJT B2. The second P-type well 32 used as the base of the parasitic NPN BJT B3 has a lower doping concentration to increase the current gain of the parasitic NPN BJT B3. The parasitic PNP BJT B2 and the parasitic NPN BJT B3 form a parasitic silicon-controlled rectifier (SCR). When the ESD current is generated, the ESD current flows through Path-1 and Path-2. Path-1 passes through the parasitic NPN BJT B1 and the parasitic NPN BJT B3. Path-2 passes through the parasitic NPN BJT B1 and the parasitic SCR. Due to the snapback properties of the parasitic SCR, the transient voltage suppression device 3 has a low holding voltage and a low clamping voltage. In addition, the transient voltage suppression device 3 has strong ESD robustness owning to Path-2 formed by the parasitic SCR.

Figure 2:
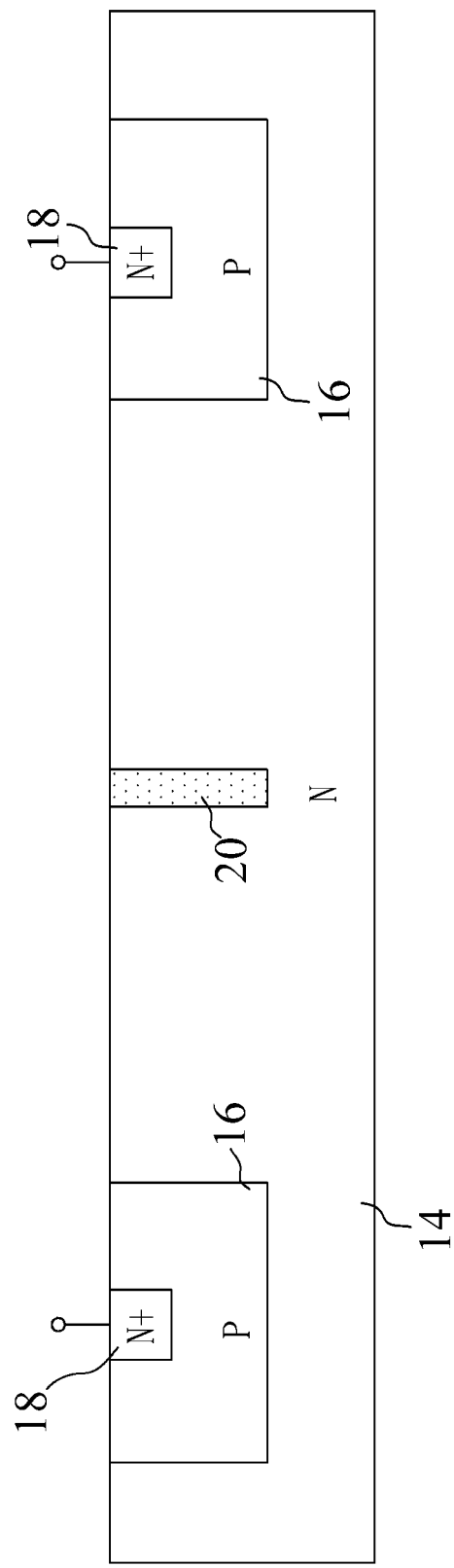
FIG. 2 is a cross-sectional view of a transient voltage suppression device in the conventional technology.
Figure 5:
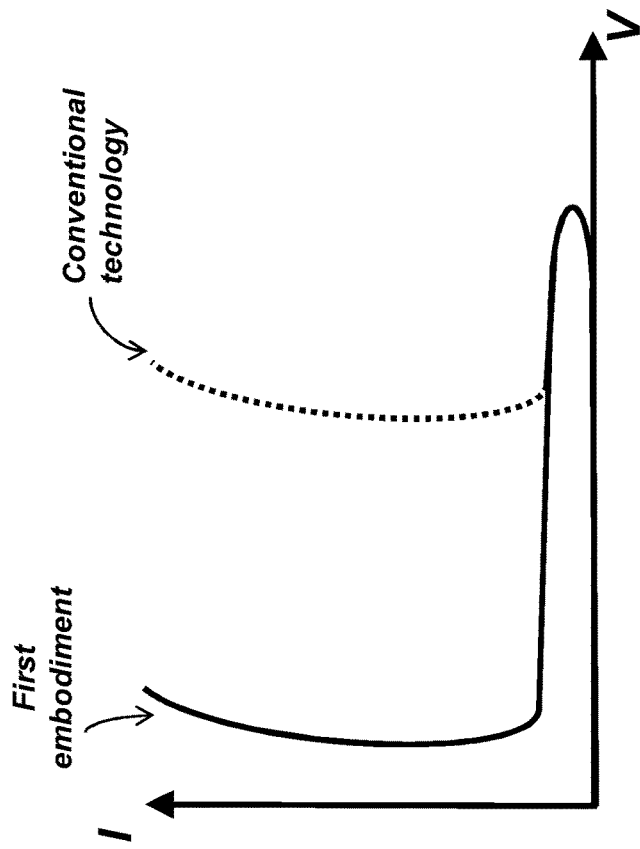
FIG. 5 is a diagram illustrating the curves of current versus voltage of the transient voltage suppression devices of FIG. 2 and FIG. 3.
Figure 6:
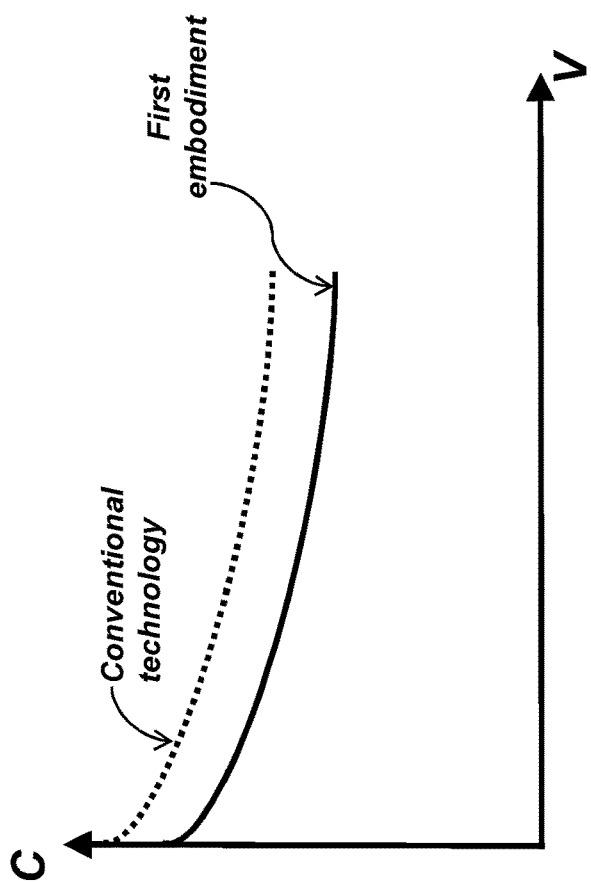
FIG. 6 is a diagram illustrating the curves of capacitance versus voltage of the transient voltage suppression devices of FIG. 2 and FIG. 3.

FIG. 5 is a diagram illustrating the curves of current versus voltage of the transient voltage suppression devices of FIG. 2 and FIG. 3. FIG. 6 is a diagram illustrating the curves of capacitance versus voltage of the transient voltage suppression devices of FIG. 2 and FIG. 3. Referring to FIG. 5 and FIG. 6, the conventional NPN BJTs coupled in series are compared with the first embodiment of the transient voltage suppression device. Compared with the conventional NPN BJTs coupled in series, the first embodiment of the transient voltage suppression device has a low parasitic capacitance, a low clamping voltage, and strong ESD robustness.

Figure 7:
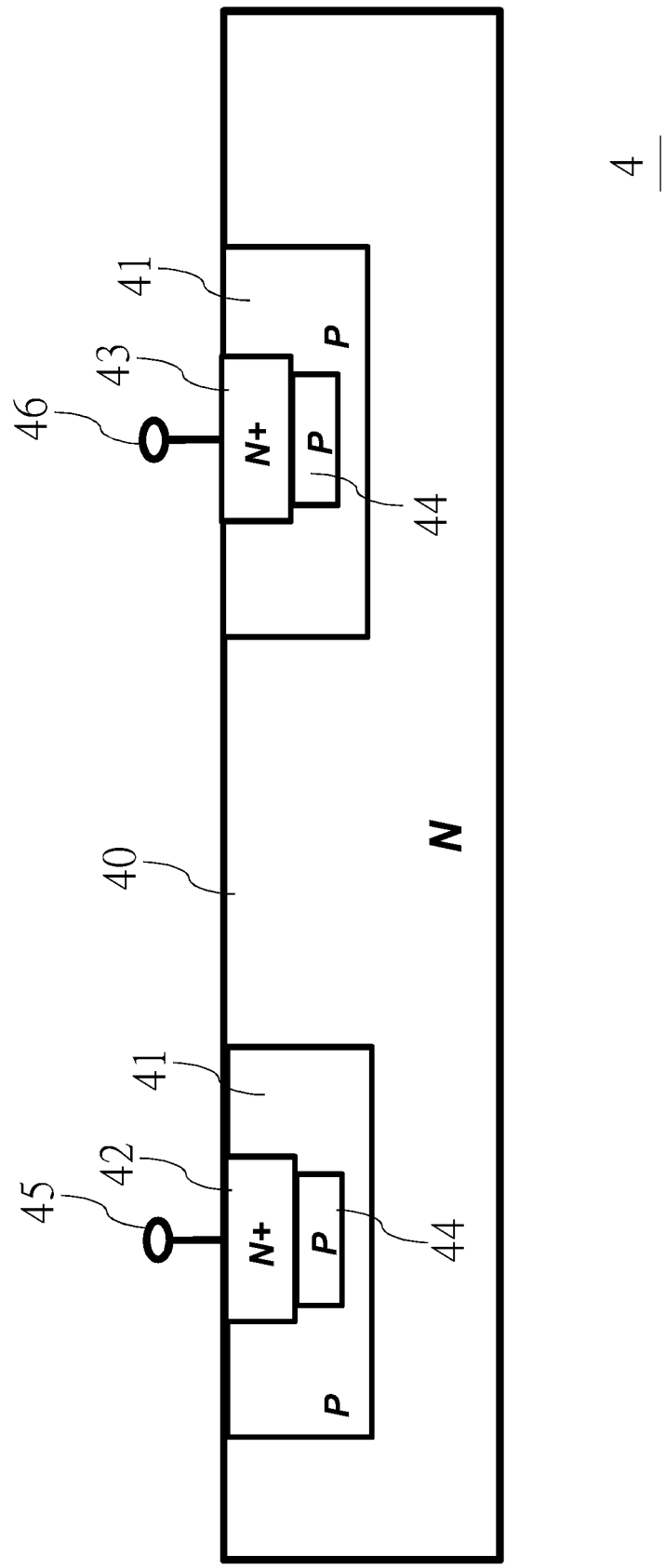
FIG. 7 is a cross-sectional view of a transient voltage suppression device according to a second embodiment of the present invention.

FIG. 7 is a cross-sectional view of a transient voltage suppression device according to a second embodiment of the present invention. Referring to FIG. 7, the second embodiment of the transient voltage suppression device is introduced as follows. A transient voltage suppression device 4 includes at least one N-type lightly-doped structure 40, two P-type wells 41, a first N-type heavily-doped area 42, a second N-type heavily-doped area 43, and two P-type doped areas 44. For convenience and clarity, the number of the N-type lightly-doped structure 40 is one. The N-type lightly-doped structure 40 is implemented with an N-type lightly-doped substrate. The P-type wells 41 are formed in the N-type lightly-doped structure 40. The first N-type heavily-doped area 42 and the second N-type heavily-doped area 43 are respectively formed in the P-type wells 41. The P-type doped areas 44, respectively formed in the P-type wells 41, respectively directly touch the bottoms of the first N-type heavily-doped area 42 and the second N-type heavily-doped area 43. There is nothing between the P-type doped area 44 and each of the first N-type heavily-doped area 42 and the second N-type heavily-doped area 43. In addition, since the layout sizes of the first N-type heavily-doped area 42 and the second N-type heavily-doped area 43 may be respectively larger than or equal to the layout sizes of the two P-type doped areas 41. That is to say, there is nothing between the side wall of each of the first N-type heavily-doped area 42 and the second N-type heavily-doped area 43 and the P-type well 41. The first N-type heavily-doped area 42 and the second N-type heavily-doped area 43 are respectively coupled to a first pin 45 and a second pin 46. Due to the P-type well 41 implemented with a lightly doped well, the junction capacitance of the N-type lightly-doped structure 40 and the P-type well 41 is low. Hence, the equivalent capacitance of the transient voltage suppression device 4 is lower than that of the transient voltage suppression device of the first embodiment. The transient voltage suppression device 4 has a low parasitic capacitance. The doping concentration of the P-type wells 41 is lower than that of the P-type doped area 44. Specifically, the P-type well 41 may have a doping concentration of $10^{14}$~$10^{18}$ cm$^{-3}$ and the P-type doped area 44 may have a doping concentration of $10^{16}$~$10^{19}$ cm$^{-3}$.

When a positive electrostatic discharge voltage is applied to the first pin 45, and a reference voltage lower than the positive electrostatic discharge voltage is applied to the second pin 46, an ESD current flows from the first pin 45 to the second pin 46 through the first N-type heavily-doped area 42, the P-type doped area 44, the P-type well 41, the N-type lightly-doped structure 40, the P-type well 41, and the second N-type heavily-doped area 43. When a positive electrostatic discharge voltage is applied to the second pin 46, and a reference voltage lower than the positive electrostatic discharge voltage is applied to the first pin 45, an ESD current flows from the second pin 46 to the first pin 45 through the second N-type heavily-doped area 43, the P-type doped area 44, the P-type well 41, the N-type lightly-doped structure 40, the P-type well 41, and the first N-type heavily-doped area 42. Since the P-type doped areas 44 are respectively formed under the first N-type heavily-doped area 42 and the second N-type heavily-doped area 43, the ESD current that flows along the upper surface of the N-type lightly-doped structure 40 is suppressed. Thus, the ESD current flows through the P-type doped area 44 to dissipate heat and improve the ESD robustness of the transient voltage suppression device 4. In addition, since the structure where the ESD current flows from the first pin 45 to the second pin 46 is the same to the structure where the ESD current from the second pin 46 to the first pin 45, the transient voltage suppression device 4 has electric symmetry.

Figure 8:
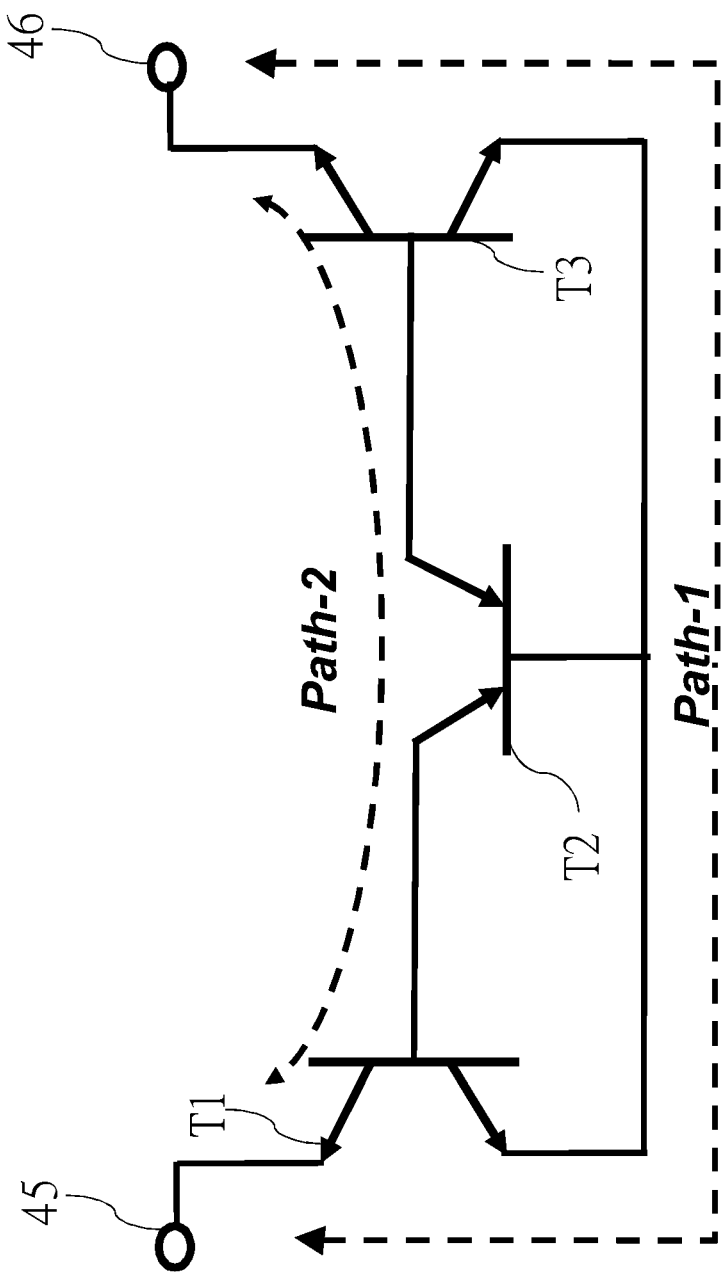
FIG. 8 is a schematic diagram illustrating an equivalent circuit of the transient voltage suppression device according to a second embodiment of the present invention.

FIG. 8 is a schematic diagram illustrating an equivalent circuit of the transient voltage suppression device according to a second embodiment of the present invention. Referring to FIG. 7 and FIG. 8, the first N-type heavily-doped area 42, the P-type doped area 44, the P-type well 41, and the N-type lightly-doped structure 40 form a parasitic NPN BJT T1. The P-type doped area 44, the P-type well 41, the N-type lightly-doped structure 40, and the P-type well 41 form a parasitic PNP BJT T2. The second N-type heavily-doped area 43, the P-type doped area 44, the P-type well 41, and the N-type lightly-doped structure 40 form a parasitic NPN BJT T3. The P-type doped area 44 used as the emitter of the parasitic PNP BJT T2 has a higher doping concentration to increase the current gain of the parasitic PNP BJT T2. The P-type well 41 used as the base of the parasitic NPN BJT T1 or T3 has a lower doping concentration to increase the current gain of the parasitic NPN BJT T1 or T3. The parasitic PNP BJT T2 and the parasitic NPN BJT T3 form a first parasitic SCR. The parasitic PNP BJT T2 and the parasitic NPN BJT T1 form a second parasitic SCR. When the ESD current is generated, the ESD current flows through Path-1 and Path-2. Path-1 passes through the parasitic NPN BJT T1 and the parasitic NPN BJT T3. Path-2 passes through the parasitic NPN BJT T1 and the first parasitic SCR or passes through the second parasitic SCR and the parasitic NPN BJT T3. Due to the snapback properties of the parasitic SCR, the transient voltage suppression device 4 has a low holding voltage and a low clamping voltage. In addition, the transient voltage suppression device 4 has strong ESD robustness owning to Path-2 formed by the parasitic SCR. Since the first parasitic SCR is symmetric to the second parasitic SCR, the transient voltage suppression device 4 has electric symmetry.

Figure 9:
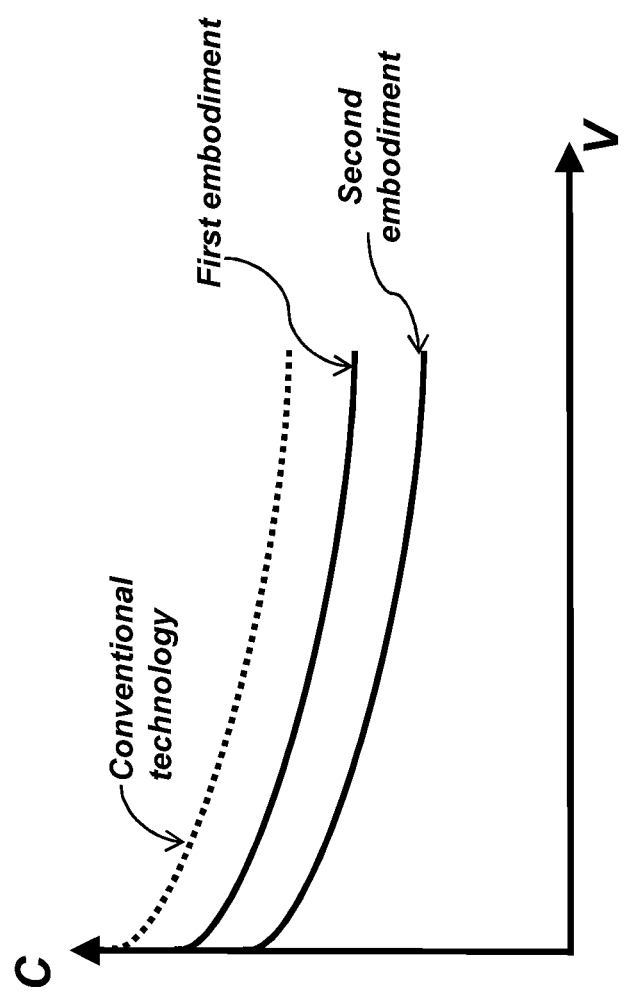
FIG. 9 is a diagram illustrating the curves of capacitance versus voltage of the transient voltage suppression devices of FIG. 2, FIG. 3, and FIG. 7.

FIG. 9 is a diagram illustrating the curves of capacitance versus voltage of the transient voltage suppression devices of FIG. 2, FIG. 3, and FIG. 7. Referring to FIG. 9, the second embodiment of the transient voltage suppression device has a lower parasitic capacitance than the first embodiment of the transient voltage suppression device.

Figure 10:
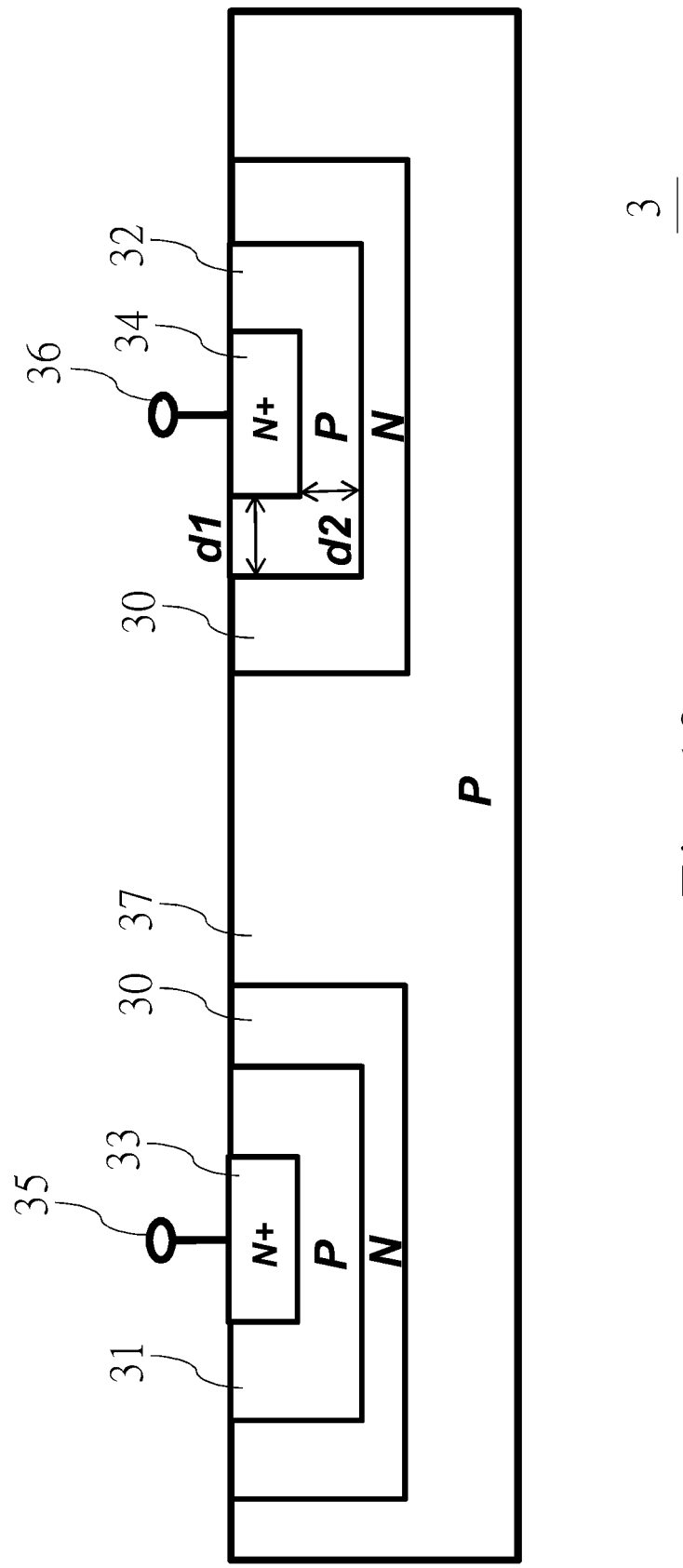
FIG. 10 is a cross-sectional view of a transient voltage suppression device according to a third embodiment of the present invention.

FIG. 10 is a cross-sectional view of a transient voltage suppression device according to a third embodiment of the present invention. Referring to FIG. 10, the third embodiment of the transient voltage suppression device is introduced as follows. Compared with the first embodiment, the third embodiment of the transient voltage suppression device 3 further includes a P-type lightly-doped substrate 37. In addition, the number of the N-type lightly-doped structure 30 of the third embodiment is two. The two N-type lightly-doped structures 30 are implemented with N-type lightly-doped wells. The N-type lightly-doped wells are formed in the P-type lightly-doped substrate 37. The first P-type well 31 and the second P-type well 32 are respectively formed in the N-type lightly-doped wells. Due to the N-type lightly-doped structure 30 and the P-type lightly-doped substrate 37, the junction capacitance between the N-type lightly-doped structure 30 and the P-type lightly-doped substrate 37 is low. Compared with the first embodiment, the third embodiment adds two parasitic capacitances, namely the junction capacitances between the N-type lightly-doped structure 30 and the P-type lightly-doped substrate 37. Thus, the third embodiment of the transient voltage suppression device 3 has a lower parasitic capacitance.

When a positive electrostatic discharge voltage is applied to the first pin 35, and a reference voltage lower than the positive electrostatic discharge voltage is applied to the second pin 36, an ESD current flows from the first pin 35 to the second pin 36 through the first N-type heavily-doped area 33, the first P-type well 31, the N-type lightly-doped structure 30, the P-type lightly-doped substrate 37, the N-type lightly-doped structure 30, the second P-type well 32, and the second N-type heavily-doped area 34.

Figure 11:
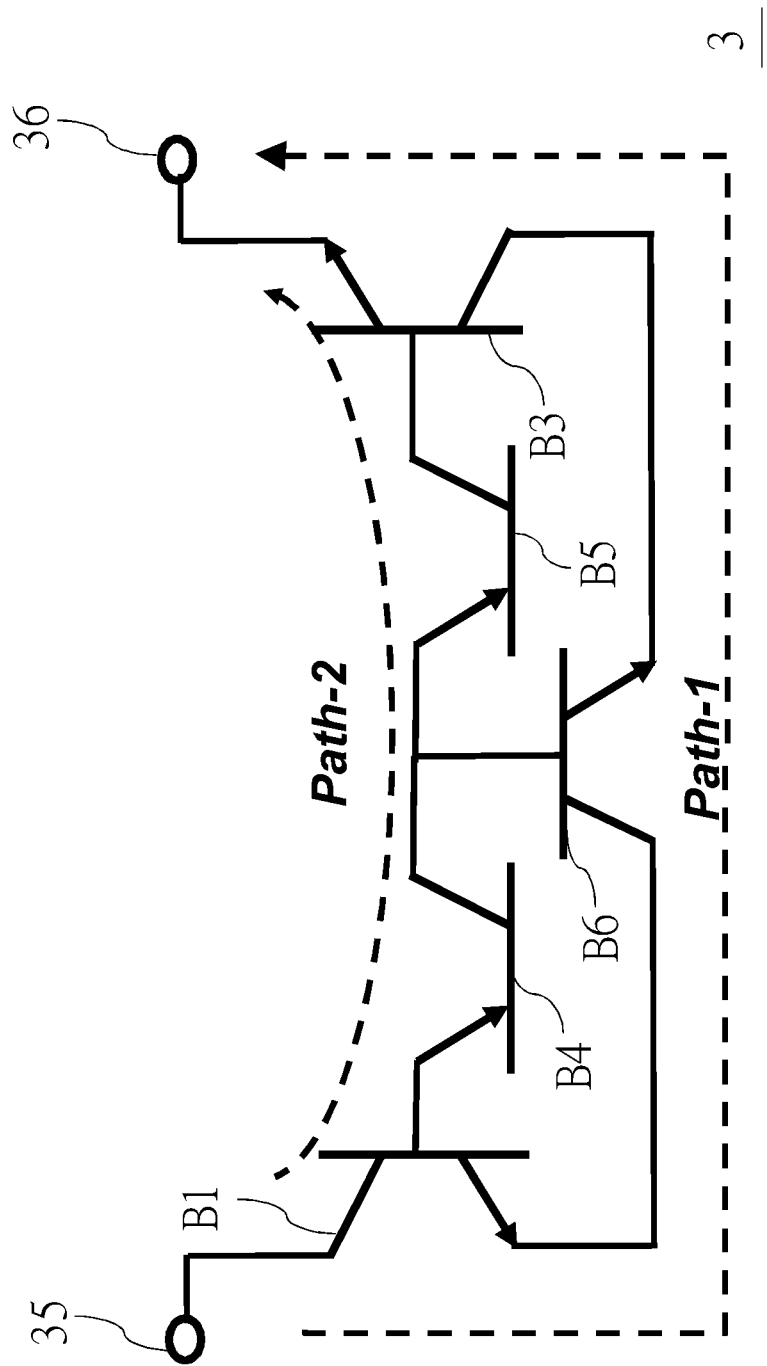
FIG. 11 is a schematic diagram illustrating an equivalent circuit of the transient voltage suppression device according to a third embodiment of the present invention.

FIG. 11 is a schematic diagram illustrating an equivalent circuit of the transient voltage suppression device according to a third embodiment of the present invention. Referring to FIG. 10 and FIG. 11, the first P-type well 31, the N-type lightly-doped structure 30, and the P-type lightly-doped substrate 37 form a parasitic PNP BJT B4. The second P-type well 32, the N-type lightly-doped structure 30, and the P-type lightly-doped substrate 37 form a parasitic PNP BJT B5. The N-type lightly-doped structure 30, the P-type lightly-doped substrate 37, and the N-type lightly-doped structure 30 form a parasitic NPN BJT B6. The first P-type well 31 used as the emitter of the parasitic PNP BJT B4 has a higher doping concentration to increase the current gain of the parasitic PNP BJT B4. The parasitic PNP BJT B4 and the parasitic NPN BJT B6 form a first parasitic SCR. The parasitic PNP BJT B5 and the parasitic NPN BJT B3 form a second parasitic SCR. When a positive electrostatic discharge voltage is applied to the first pin 35, and a reference voltage lower than the positive electrostatic discharge voltage is applied to the second pin 36, the ESD current flows through Path-1 and Path-2. Path-1 passes through the parasitic NPN BJT B1, the parasitic NPN BJT B6, and the parasitic NPN BJT B3. Path-2 passes through the parasitic NPN BJT B1, the first parasitic SCR, and the second parasitic SCR. Due to the snapback properties of the parasitic SCR, the transient voltage suppression device 3 has a low holding voltage and a low clamping voltage. In addition, the transient voltage suppression device 3 has strong ESD robustness owning to Path-2 formed by the parasitic SCRs.

Figure 12:
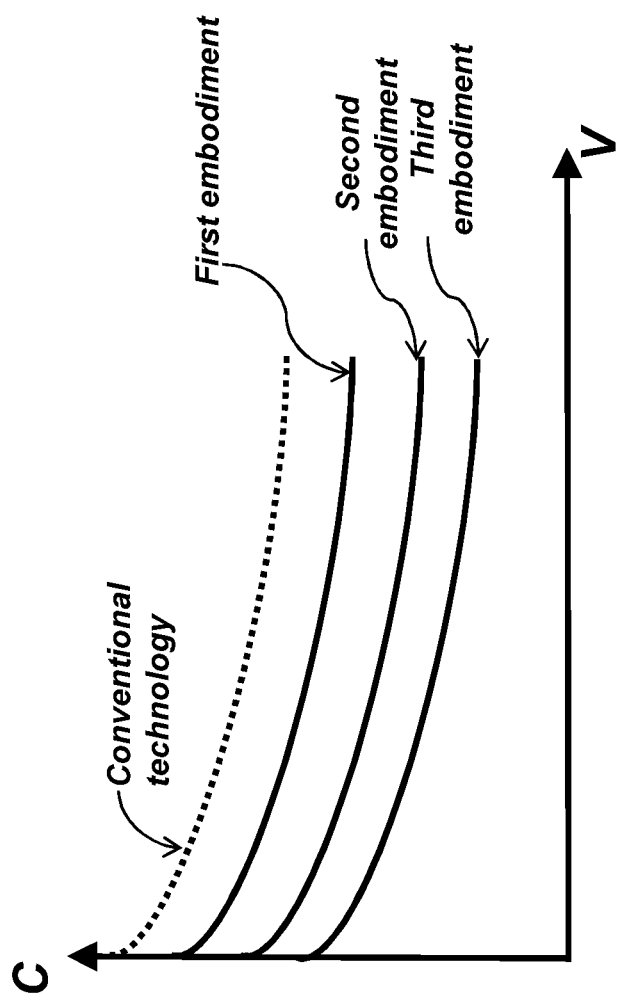
FIG. 12 is a diagram illustrating the curves of capacitance versus voltage of the transient voltage suppression devices of FIG. 2, FIG. 3, FIG. 7, and FIG. 10.

FIG. 12 is a diagram illustrating the curves of capacitance versus voltage of the transient voltage suppression devices of FIG. 2, FIG. 3, FIG. 7, and FIG. 10. Referring to FIG. 12, the third embodiment of the transient voltage suppression device has a lower parasitic capacitance than the second embodiment of the transient voltage suppression device.

Figure 13:
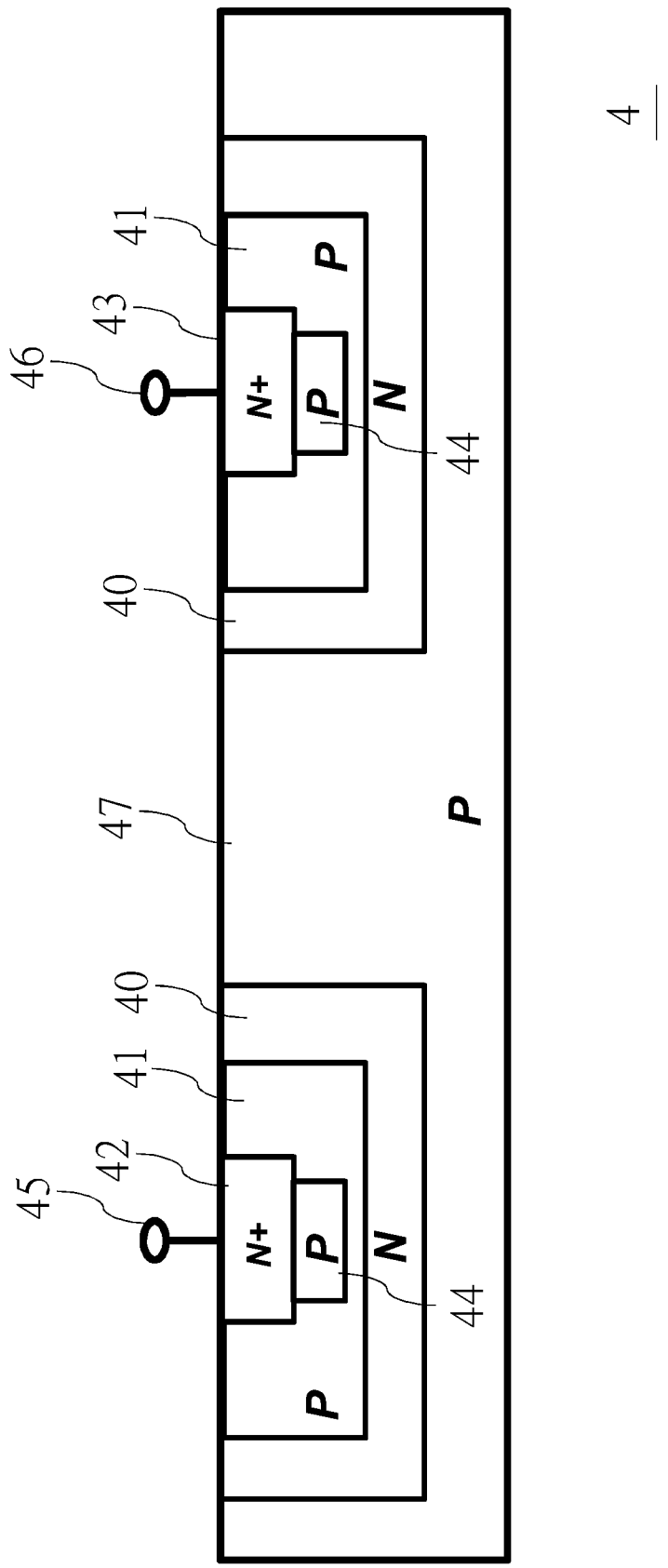
FIG. 13 is a cross-sectional view of a transient voltage suppression device according to a fourth embodiment of the present invention.

FIG. 13 is a cross-sectional view of a transient voltage suppression device according to a fourth embodiment of the present invention. Referring to FIG. 13, the fourth embodiment of the transient voltage suppression device is introduced as follows. Compared with the second embodiment, the fourth embodiment of the transient voltage suppression device 4 further includes a P-type lightly-doped substrate 47. The number of the N-type lightly-doped structures 40 is two. The two N-type lightly-doped structures 40 are implemented with N-type lightly-doped wells. The N-type lightly-doped wells are formed in the P-type lightly-doped substrate 47. The P-type wells 41 are respectively formed in the N-type lightly-doped wells. Due to the N-type lightly-doped structure 40 and the P-type lightly-doped substrate 47, the junction capacitance of the N-type lightly-doped structure 40 and the P-type lightly-doped substrate 47 is low. Moreover, because of the P-type well 41 implemented with a lightly doped well, the junction capacitance of the N-type lightly-doped structure 40 and the P-type well 41 is low. Hence, the equivalent capacitance of the transient voltage suppression device 4 of the fourth embodiment is lower than that of the transient voltage suppression device of the third embodiment.

When a positive electrostatic discharge voltage is applied to the first pin 45, and a reference voltage lower than the positive electrostatic discharge voltage is applied to the second pin 46, an ESD current flows from the first pin 45 to the second pin 46 through the first N-type heavily-doped area 42, the P-type doped area 44, the P-type well 41, the N-type lightly-doped structure 40, the P-type lightly-doped substrate 47, the N-type lightly-doped structure 40, the P-type well 41, and the second N-type heavily-doped area 43. When a positive electrostatic discharge voltage is applied to the second pin 46, and a reference voltage lower than the positive electrostatic discharge voltage is applied to the first pin 45, an ESD current flows from the second pin 46 to the first pin 45 through the second N-type heavily-doped area 43, the P-type doped area 44, the P-type well 41, the N-type lightly-doped structure 40, the P-type lightly-doped substrate 47, the N-type lightly-doped structure 40, the P-type well 41, and the first N-type heavily-doped area 42. Since the P-type doped areas 44 are respectively formed under the first N-type heavily-doped area 42 and the second N-type heavily-doped area 43, the ESD current that flows along the upper surface of the P-type lightly-doped substrate 47 is suppressed. Thus, the ESD current flows through the P-type doped area 44 to dissipate heat and improve the ESD robustness of the transient voltage suppression device 4. In addition, since the structure where the ESD current flows from the first pin 45 to the second pin 46 is the same to the structure where the ESD current from the second pin 46 to the first pin 45, the transient voltage suppression device 4 has electric symmetry.

Figure 14:
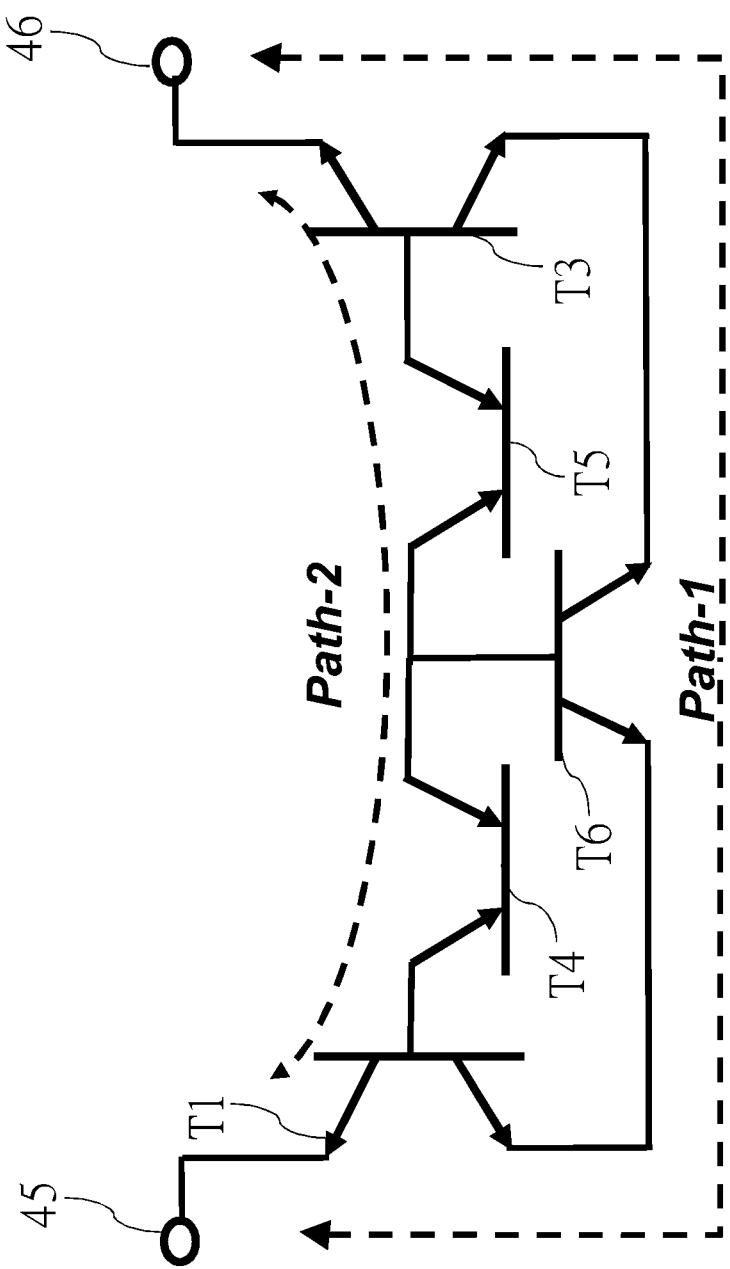
FIG. 14 is a schematic diagram illustrating an equivalent circuit of the transient voltage suppression device according to a fourth embodiment of the present invention.

FIG. 14 is a schematic diagram illustrating an equivalent circuit of the transient voltage suppression device according to a fourth embodiment of the present invention. Referring to FIG. 13 and FIG. 14, the P-type doped area 44, the P-type well 41, the N-type lightly-doped structure 40, and the P-type lightly-doped substrate 47 form a parasitic PNP BJT T4. The P-type lightly-doped substrate 47, the N-type lightly-doped structure 40, the P-type doped area 44, and the P-type well 41 form a parasitic PNP BJT T5. The N-type lightly-doped structure 40, the P-type lightly-doped substrate 47, and the N-type lightly-doped structure 40 form a parasitic NPN BJT T6. The P-type doped area 44 used as the emitter of the parasitic PNP BJT T4 or T5 has a higher doping concentration to increase the current gain of the parasitic PNP BJT T4 or T5. The parasitic PNP BJT T4 and the parasitic NPN BJT T6 form a first parasitic SCR. The parasitic NPN BJT T3 and the parasitic PNP BJT T5 form a second parasitic SCR. The parasitic PNP BJT T5 and the parasitic NPN BJT T6 form a third parasitic SCR. The parasitic NPN BJT T1 and the parasitic PNP BJT T4 form a fourth parasitic SCR. When the ESD current is generated, the ESD current flows through Path-1 and Path-2. Path-1 passes through the parasitic NPN BJT T1, the parasitic NPN BJT T6, and the parasitic NPN BJT T3. Path-2 passes through the parasitic NPN BJT T1, the first parasitic SCR, the second parasitic SCR when a positive electrostatic discharge voltage and a reference voltage lower than the positive electrostatic discharge voltage is applied to the first pin 45 and the second pin 46 respectively. Path-2 passes through the parasitic NPN BJT T3, the third parasitic SCR, the fourth parasitic SCR when a positive electrostatic discharge voltage and a reference voltage lower than the positive electrostatic discharge voltage is applied to the second pin 46 and the first pin 45 respectively. Due to the snapback properties of the parasitic SCR, the transient voltage suppression device 4 has a low holding voltage and a low clamping voltage. In addition, the transient voltage suppression device 4 has strong ESD robustness owning to Path-2 formed by the parasitic SCR. Since the first parasitic SCR is symmetric to the second parasitic SCR, the transient voltage suppression device 4 has electric symmetry.

Figure 15:
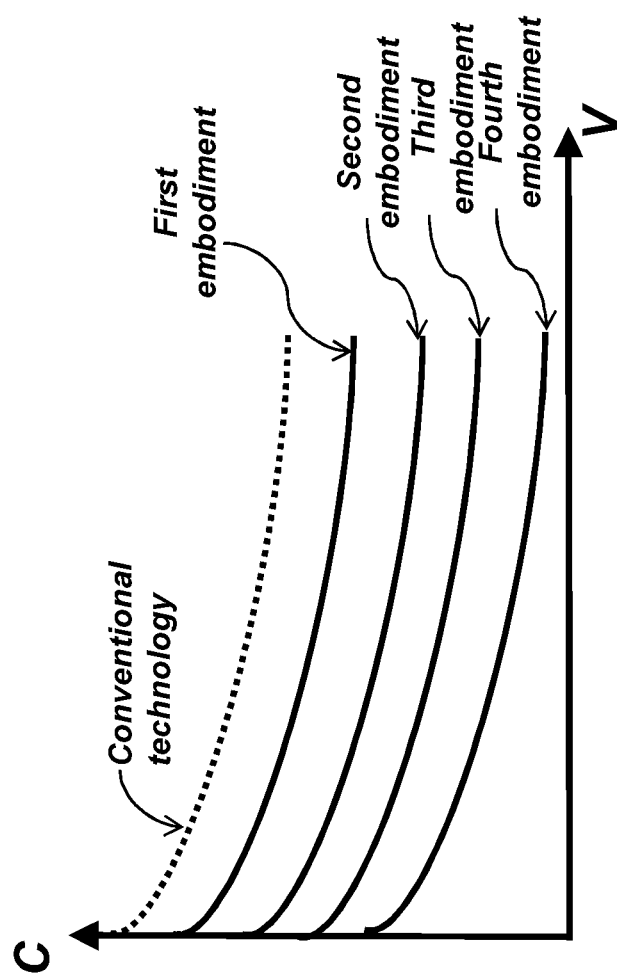
FIG. 15 is a diagram illustrating the curves of capacitance versus voltage of the transient voltage suppression devices of FIG. 2, FIG. 3, FIG. 7, FIG. 10, and FIG. 13.

FIG. 15 is a diagram illustrating the curves of capacitance versus voltage of the transient voltage suppression devices of FIG. 2, FIG. 3, FIG. 7, FIG. 10, and FIG. 13. Referring to FIG. 15, the fourth embodiment of the transient voltage suppression device has a lower parasitic capacitance than the third embodiment of the transient voltage suppression device.

According to the embodiments provided above, the transient voltage suppression device embeds the SCR into the BJT to have a low parasitic capacitance, a low clamping voltage, and strong ESD robustness.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A transient voltage suppression device comprising:
   at least one N-type lightly-doped structure;
   a first P-type well and a second P-type well formed in the at least one N-type lightly-doped structure; and
   a first N-type heavily-doped area and a second N-type heavily-doped area respectively formed in the first P-type well and the second P-type well, wherein a doping concentration of the first P-type well is higher than that of the second P-type well.

2. The transient voltage suppression device according to claim 1, wherein the at least one N-type lightly-doped structure is an N-type lightly-doped substrate.

3. The transient voltage suppression device according to claim 1, wherein the first N-type heavily-doped area and the second N-type heavily-doped area are respectively coupled to a first pin and a second pin.

4. The transient voltage suppression device according to claim 1, wherein the second P-type well has a sidewall between the first P-type well and the second N-type heavily-doped area, the second N-type heavily-doped area has a first shortest distance from the sidewall of the second P-type well, the second N-type heavily-doped area has a second shortest distance from a bottom of the second P-type well, and the first shortest distance is greater than or equal to the second shortest distance.

\* \* \* \* \*